(12) United States Patent
Brownell et al.

(10) Patent No.: US 6,490,167 B1
(45) Date of Patent: Dec. 3, 2002

(54) SEMICONDUCTOR PACKAGE EJECTOR

(75) Inventors: Michael Philip Brownell, Los Gatos, CA (US); James G. Maveety, San Jose, CA (US); Richard Michael Ramirez, Fremont, CA (US); William Arthur Samaras, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/437,244

(22) Filed: Nov. 10, 1999

(51) Int. Cl.[7] .................................................. H05K 7/02
(52) U.S. Cl. ...................................................... 361/760
(58) Field of Search ................................ 439/152, 153, 439/155, 159, 160; 361/754, 760, 801, 807, 809

(56) References Cited

U.S. PATENT DOCUMENTS

| | | | | |
|---|---|---|---|---|
| 4,190,310 A | * | 2/1980 | Bright et al. | 439/153 |
| 4,531,795 A | * | 7/1985 | Sinclair | 439/152 |
| 4,666,199 A | | 5/1987 | Cheh | 294/106 |
| 5,380,213 A | * | 1/1995 | Piorunneck et al. | 439/160 |
| 5,707,245 A | * | 1/1998 | Yamamoto et al. | 439/160 |
| 6,022,229 A | * | 2/2000 | Nishimura et al. | 439/160 |
| 6,042,401 A | * | 3/2000 | Oguchi et al. | 439/159 |
| 6,185,106 B1 | * | 2/2001 | Mueller | 361/798 |
| 6,224,404 B1 | * | 5/2001 | Sauer | 439/160 |

* cited by examiner

Primary Examiner—Lynn D. Feild
Assistant Examiner—Thanh-Tam Le
(74) Attorney, Agent, or Firm—Kenyon & Kenyon

(57) ABSTRACT

In an embodiment of the present invention, an apparatus to eject a semiconductor package from a semiconductor package socket includes a package ejector coupled to a semiconductor package socket. The package ejector can include an ejector cam and be coupled to an upper surface of the semiconductor package socket.

24 Claims, 5 Drawing Sheets

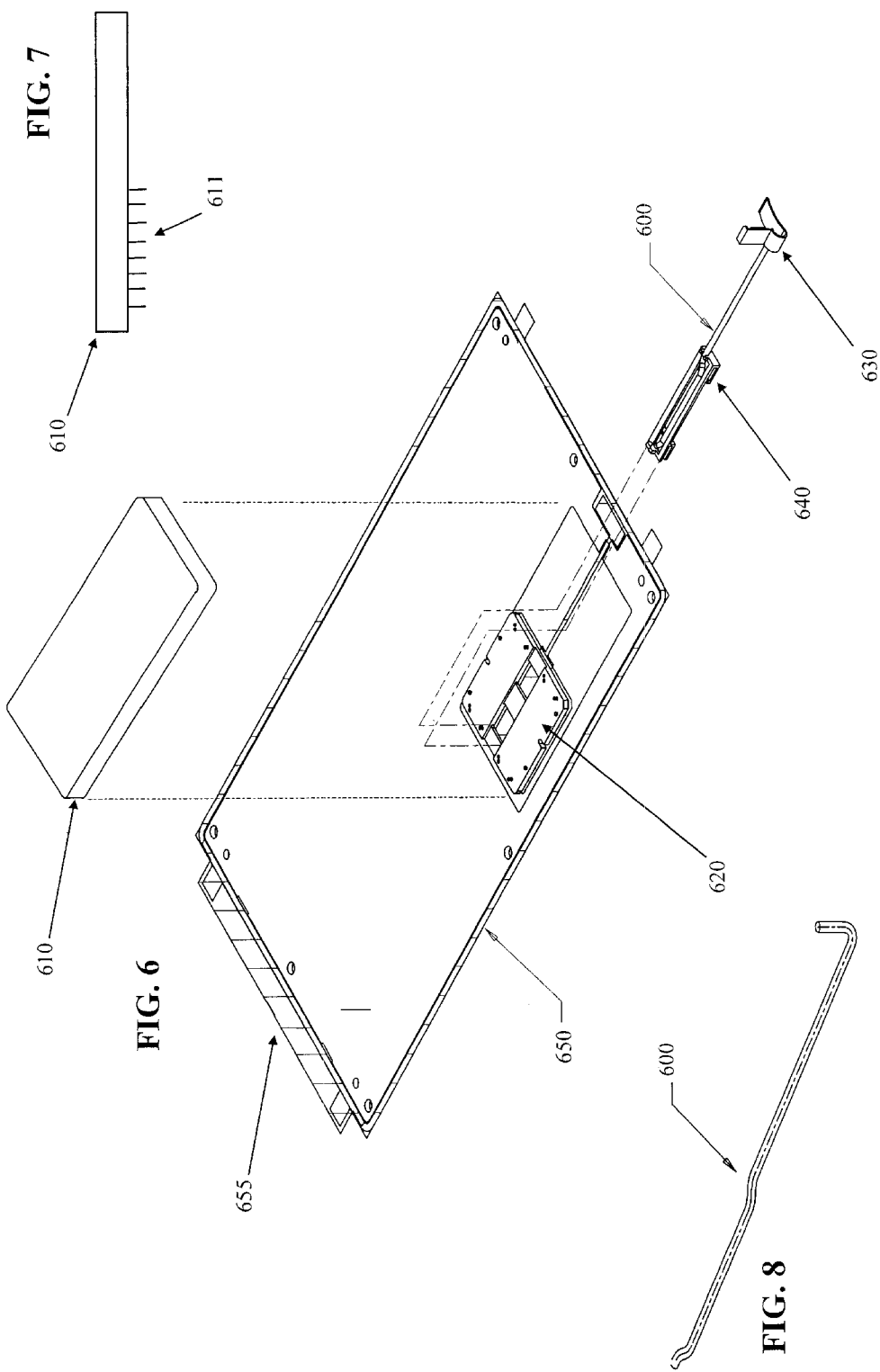

FIG. 9
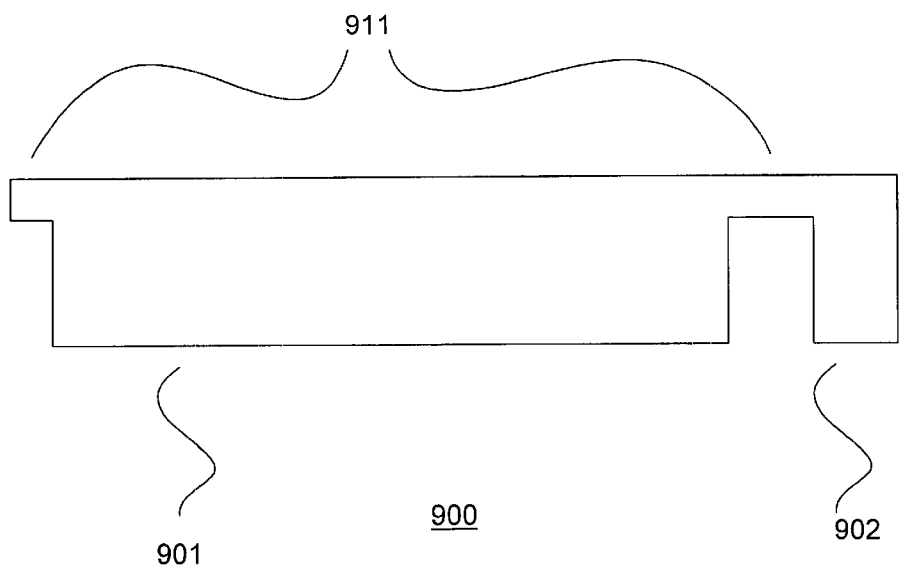
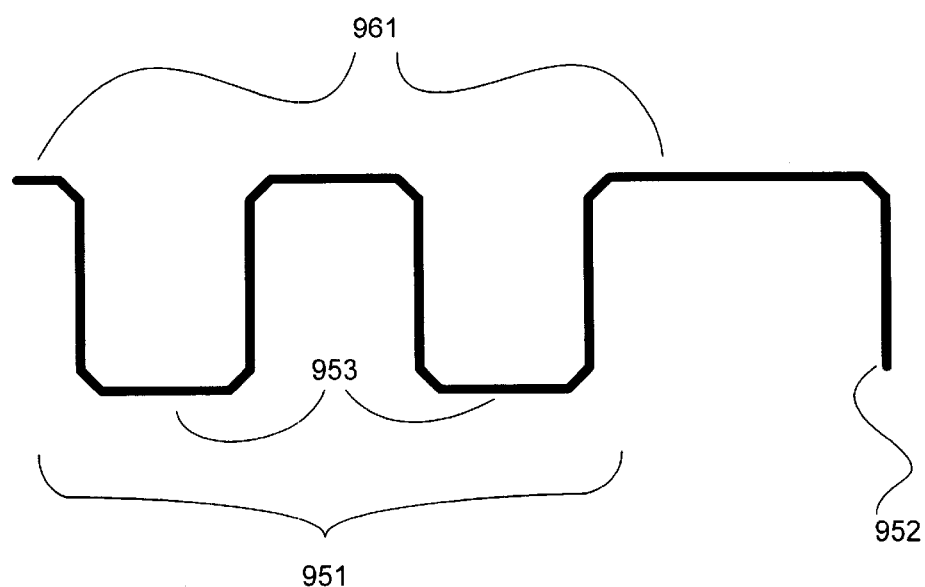

SEMICONDUCTOR PACKAGE EJECTOR

FIELD OF THE INVENTION

Embodiments of the present invention provide an apparatus and method for ejecting a semiconductor package. More particularly, embodiments of the present invention provide an apparatus and method for ejecting a semiconductor package from a socket.

BACKGROUND OF THE INVENTION

A known semiconductor package extractor is a screw handle extractor that pulls a semiconductor package from a socket. FIG. 1 shows an illustration of a known screw handle extractor 100 for pulling a semiconductor package 150 (e.g., a pin grid array package) from a socket 120. Screw handle extractor 100 includes a handle 101 affixed to a screw shaft 102. Bracket 103 is also affixed to screw shaft 102. Screw shaft 102 rotates through threaded passage 104 of housing 105. Bracket 103 includes lip 106 and lip 107, each of which can be positioned under an edge of semiconductor package 150. Housing 105 can rest upon an upper surface of socket 120, which includes a plurality of pin receptors 121 to receive pins 156 and mechanically and electrically couple package 150 to socket 120.

Package 150 can include a cover 151 that may disperse heat from a semiconductor die 153. A thermal interface material 152 (e.g., an elastomer type material, a grease and phase change material, etc.) mechanically and thermally couples cover 151 and semiconductor die 153. A plurality of solder bump connections mechanically and electrically couple semiconductor die 153 and substrate 155. The package 150 includes at least one wiring layer (not shown) to electrically couple semiconductor die 153 to pins 156.

To extract package 150 from socket 120, housing 105 can rest upon the upper surface of socket 120 and each of lips 106, 107 may be positioned under an edge of package 150. Handle 101 is then rotated to move bracket 103 away from socket 120. As bracket 103 moves away from socket 120, lips 106 and 107 pull package 150 out of socket 120.

FIG. 2 is an illustration of the forces exerted upon a package during extraction of the package from a socket by the screw handle extractor illustrated in FIG. 1. Lips 106 and 107 apply pulling forces 201 and 202 to the edges of package 150 in a direction away from socket 120. Friction between the pins of package 150 and socket 120 exerts retention forces 205 about the central portion of package 150 and in the direction of socket 120. When the pulling forces 201 and 202 exceed the retention forces 205, the package 150 can be pulled out of the socket 120.

Pulling package 150 from socket 120 with screw handle extractor 100 can disadvantageously result in degradation of the mechanical and thermal coupling of cover 151 and semiconductor die 153. FIG. 3 shows an illustration of degradation of the thermal coupling between a package cover and a semiconductor die. The pulling forces 201 and 202 applied along the edges of package 150 can result in cover 151 being deflected away from semiconductor die 153 and may degrade the thermal interface between the cover 151 and semiconductor die 153. For example, thermal interface material 152 may delaminate from cover 151 and/or semiconductor die 153. The pulling forces 201 and 202 can also cause substrate deflection under the semiconductor die 153 during package extraction.

Other known apparatus that can remove a pin grid array package from a socket include a raked-end crowbar. The raked-end crowbar can lever a pin grid array package away from the socket. The tines of the raked-end of the crowbar can be positioned between the pins of the pin grid array under an edge of the pin grid array package. The other end of the crowbar is then pushed down to lever the edge of the pin grid array package away from the socket. Use of a raked-end crowbar can also disadvantageously cause thermal interface degradation between cover 151 and semiconductor die 153. Another known apparatus to facilitate removal of a semiconductor package from a socket is a zero insertion force (ZIF) socket. A ZIF socket typically requires longer stubs—the electrical path from the package pins to the board bus—which can disadvantageously degrade system performance.

In view of the foregoing, it can be appreciated that a substantial need exists for a method and system which can advantageously eject a semiconductor package from a socket.

SUMMARY OF THE INVENTION

Embodiments of the present invention provide apparatus and methods to eject a semiconductor package from a semiconductor package socket. A package ejector can be coupled to a semiconductor package socket. The package ejector can include an ejector cam and be coupled to an upper surface of the semiconductor package socket.

BRIEF DESCRIPTION OF THE DRAWINGS

FIG. 6 is an illustration of a package ejector system in accordance with another embodiment of the present invention.

FIG. 7 shows a side view of the semiconductor package illustrated in FIG. 6.

FIG. 8 shows an isometric view of the package ejector illustrated in FIG. 6.

FIG. 9 shows package ejectors in accordance with additional embodiments of the present invention.

DETAILED DESCRIPTION

Embodiments of apparatus and methods to eject a semiconductor package from a socket are described. In the following description, for purposes of explanation, numerous specific details are set forth to provide a thorough understanding of the present invention. It will be appreciated, however, by one skilled in the art that the present invention may be practiced without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the present invention.

Figure 4:
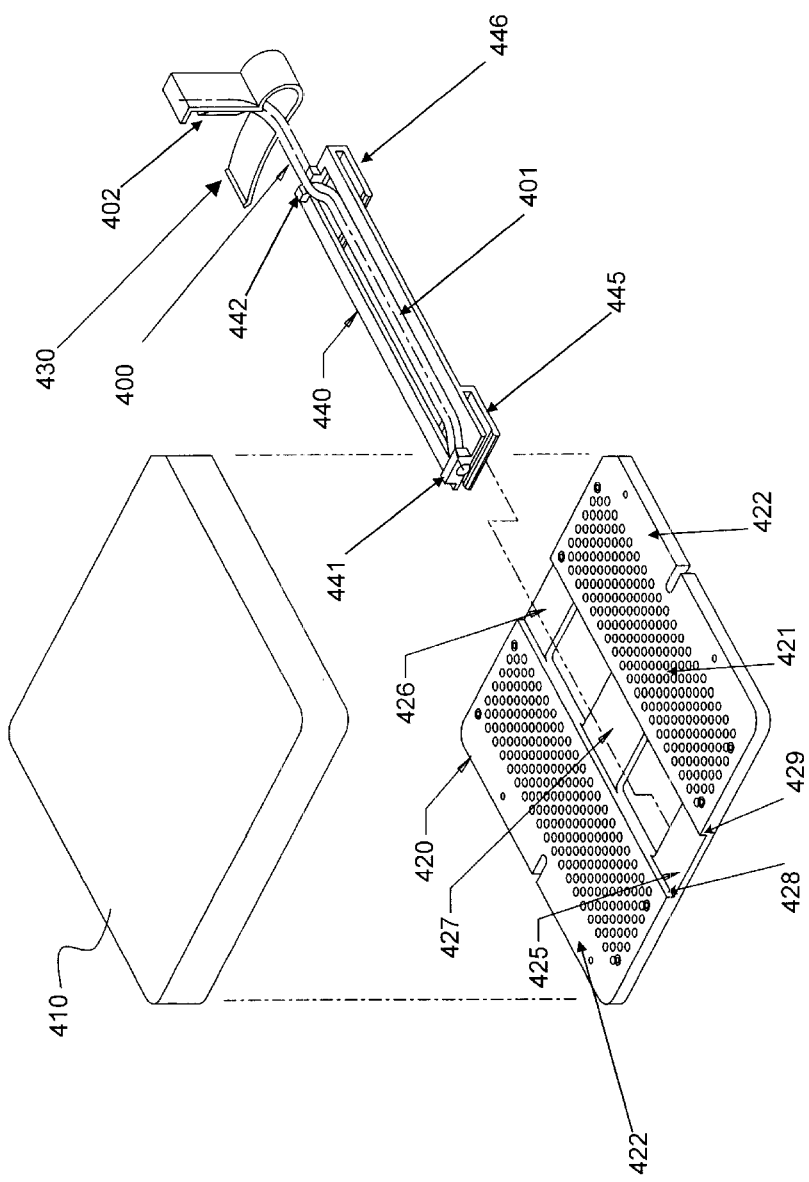
FIG. 4 is an exploded perspective view of an embodiment of a package ejector system in accordance with an embodiment of the present invention.

FIG. 4 is an exploded perspective view of a package ejector in accordance with an embodiment of the present invention. In one embodiment, package ejector 400 is a stainless steel wire unit including an ejector cam 401 and a handle 402. Embodiments of package ejectors also are illustrated in FIGS. 5, 6, 8, and 9 and further described below.

Ejector housing 440 can be coupled to each of package ejector 400 and socket 420. The term "coupled" means connected directly or indirectly. Package ejector 400 can be rotatably coupled to ejector housing 440 via wire cradles 441, 442 such that ejector cam 401 resides between wire cradles 441, 442. In one embodiment, ejector housing 440 is composed of Lexan® 3412R, 10% glass filled polycarbonate, available from GE Polymerland of Huntersville, N.C. (Lexan® is a registered trademark of General Electric Company of Schenectady, N.Y.). Ejector housing 440 can be rigidly coupled to socket 420 via tines 445, 446 of ejector housing 440 and bridges 425, 426 of socket 420. In one embodiment, tine 445 clips bridge 425 and tine 446 clips bridge 426 to rigidly couple ejector housing 440 to socket 420.

Socket 420, in one embodiment includes uppermost surfaces 422 that define an uppermost surface plane. The upper surfaces of bridges 425, 426, and 427 define a bottom plane of an upper surface channel of socket 420. Upper surface channel sidewalls 428, 429 define the sides of the upper surface channel of socket 420.

In another embodiment, a package ejector is directly coupled to a socket and resides in an upper surface channel of the socket. For example, a socket can include wire cradle points to rotatably couple a package ejector to the socket. In one embodiment, a socket can include a pair of wire cradle points (e.g., such as the wire cradle points 441, 442), formed on an upper surface of the socket (e.g., on bridges 425, 426 within the upper surface channel of the socket).

Figure 5:
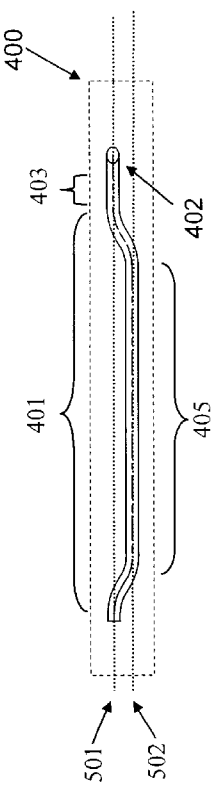
FIG. 5 shows a top view of the package ejector illustrated in FIG. 4.

FIG. 5 shows a top view of the package ejector illustrated in FIG. 4. The package ejector 400, in one embodiment, includes handle 402, ejector cam 401, and a tie bar 403. Tie bar 403 can couple handle 402 to ejector cam 401. A force can be applied to handle 402 to rotate the package ejector about an ejector rotational axis 501 passing through tie bar 403. Referring to FIG. 4, the ejector rotational axis passes through tie bar 403 and wire cradles 441, 442 of ejector housing 440. Referring to FIG. 5, ejector cam 401, in one embodiment, includes an ejector cam bar 405 that runs along a cam bar axis 502. The cam bar axis 502, in one embodiment, is parallel to the ejector rotational axis 501 and offset from the ejector rotational axis 501 by approximately 0.21 inches. Other offsets can be used in other embodiments based on component dimensions, system parameters, etc. In another embodiment, an ejector cam includes an ejector paddle that spans both an ejector rotational axis and a cam bar axis.

In one embodiment, when the package ejector 400 is coupled to the socket 420, the package ejector 400, including the ejector cam 401, can have a regular position and an eject position. When the package ejector 400 and the ejector cam 401 are each in the regular position, the handle 402 is normal to the uppermost surface plane of socket 420 and the ejector cam 401 lies parallel to the bottom plane of the upper surface channel of socket 420. As used to described embodiments of the present invention, when the ejector cam 401 lies parallel to the bottom plane of the upper surface channel, a plane passing through the ejector rotational axis 501 and the cam bar axis 502 is parallel to the bottom plane of the upper surface channel of socket 420. In the embodiment illustrated in FIG. 4, the package ejector 400 and the ejector cam 401 are in a regular position.

A package ejector return clip 430 can be coupled to handle 402. Return clip 430, in one embodiment, is composed of molded plastic (e.g., Ultem® 1010 unfilled, available from GE Polymerland of Huntersville, N.C. (Ultem® is a registered trademark of General Electric Company), etc.) and can have an uncompressed position and a compressed position. The return clip 430 is illustrated in an uncompressed position in FIG. 4 and holds handle 402 in a regular position (e.g., normal to the uppermost surface plane of the socket 420) absent any external force.

A turning force can be applied to handle 402 (e.g., by a thumb, etc.) to rotate the package ejector 400 about the ejector rotational axis 501. In an embodiment including a return clip, when the turning force applied to handle 402 is sufficient to compress return clip 430, the package ejector 400 and ejector cam 401 can rotate to the eject position. When the package ejector 400 and ejector cam 401 are in the eject position, the handle 402 can lie in a plane parallel to the uppermost surface plane of the socket 420 and the ejector cam 401 is positioned normal to the bottom plane of the upper surface channel of socket 420. As used to described embodiments of the present invention, when the ejector cam 401 is positioned normal to the bottom plane of the upper surface channel, a plane passing through the ejector rotational axis and the cam bar axis is perpendicular to the bottom plane of the upper surface channel of socket 420. The return clip 430 can rotate the package ejector 400 to the regular position from the eject position when the turning force applied to handle 402 is withdrawn, is insufficient to keep the return clip 430 in a compressed position, etc.

In another embodiment, a package ejector includes a slotted screw head coupled to an ejector cam. The package ejector in such an embodiment can be rotated from a regular position to an eject position when a screwdriver is inserted into the slotted screw head and turned to rotate the package ejector into the eject position (e.g., turned in a clockwise direction). When such an embodiment lacks a package ejector return clip, the package ejector can be returned to the regular position from the eject position by turning the screwdriver to rotate the package ejector into the regular position (e.g., turned in a counterclockwise direction).

Figure 1:
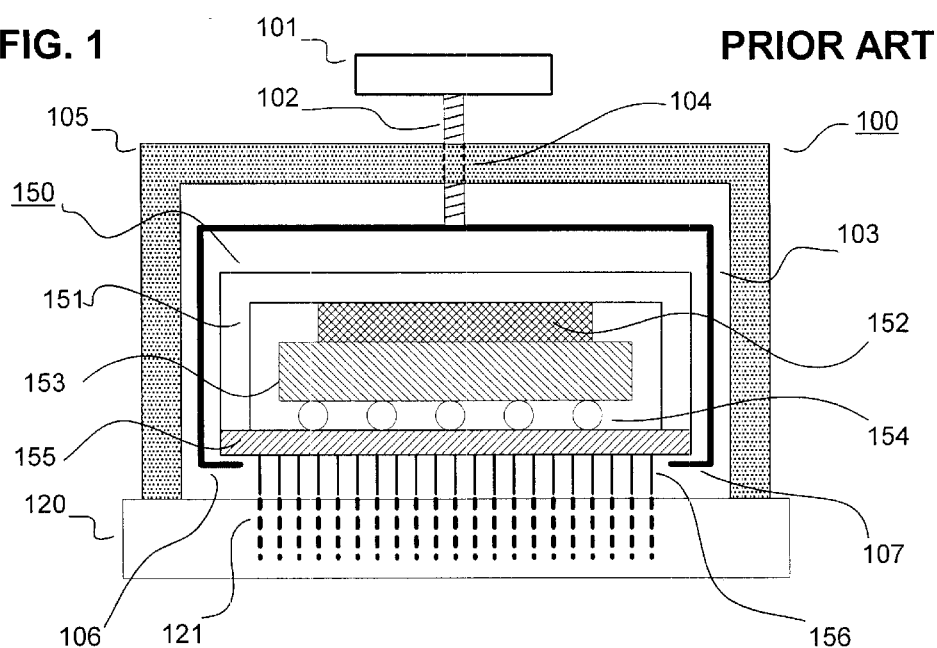
FIG. 1 shows an illustration of a known screw handle extractor for pulling a semiconductor package from a socket.
Figure 2:
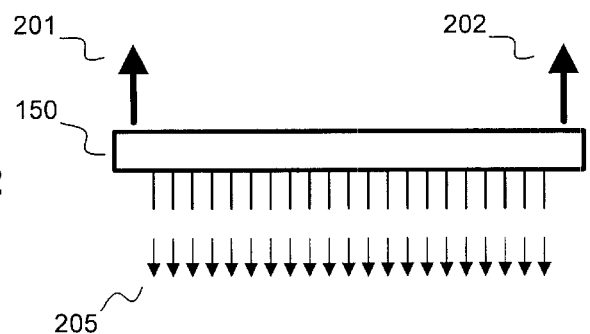
FIG. 2 is an illustration of the forces exerted upon a package during extraction of the package from a socket by the screw handle extractor illustrated in FIG. 1.
Figure 3:
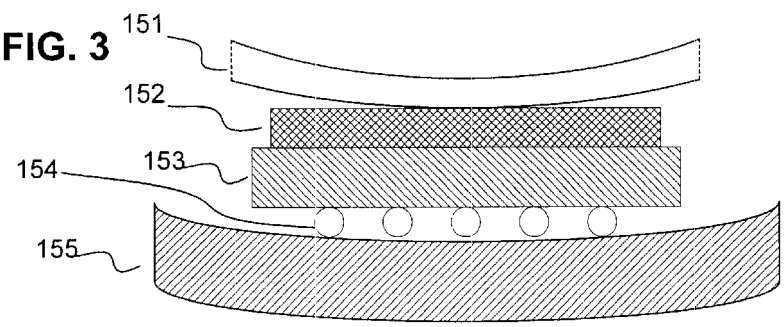
FIG. 3 shows an illustration of degradation of the thermal coupling between a package cover and a semiconductor die.

Semiconductor package 410 can be coupled to (e.g., inserted into) the socket 420. In one embodiment, semiconductor package 410 is a pin grid array package and includes a plurality of pins (not shown). Socket 420 can include a plurality of pin receptors 421, into which the pins of semiconductor package 410 may be inserted. Semiconductor package 410 can include a semiconductor die, such as a processor (e.g., an Itanium™ processor manufactured by Intel Corporation of Santa Clara, Calif. (Itanium™ is a trademark of Intel Corporation of Santa Clara, Calif. (registration pending)), etc.). In another embodiment, the semiconductor package 410 can include a plurality of semiconductor die that constitute a multi-chip module (MCM). In a further embodiment, the semiconductor can be an Application Specific Integrated Circuit (ASIC). In an embodiment, the semiconductor package is a package such as is illustrated in FIG. 1 and described above.

Semiconductor package 410 can include components (e.g., a cover, a substrate, etc.) composed of ceramic, metallic, plastic, organic material, etc. Plastic, organic, and other less rigid components (e.g., an organic substrate, an organic cover, etc.) can disadvantageously experience deflection or undesirable stresses when a semiconductor package is pulled or pried from a socket. Deflection can degrade the thermal interface between the semiconductor die and heat transfer components of the package (e.g., a thermal interface material, a cover, etc.). Embodiments of the present invention may advantageously reduce such deflection by pushing the semiconductor package away from the socket and thereby keeping the thermal interface between the semiconductor die and heat transfer components in compression.

In one embodiment, semiconductor package 410 is coupled to the socket 420, and the ejector cam 401 of package ejector 400 resides between the semiconductor package 410 and socket 420. For example, ejector cam 401 can be disposed between the semiconductor package 410 and socket 420 and reside in the upper surface channel of socket 420. When a turning force, in one embodiment, is applied to handle 402, the package ejector 400 rotates and the turning force is transferred to the ejector cam 401 via the tie bar 403. As the ejector cam 401 rotates away from the regular position toward the eject position, the ejector cam 401 can contact an interior portion of the underside of semiconductor package 410 and apply an ejection force to an interior portion of the underside of semiconductor package 410. The ejection force applied by ejector cam 401, in one embodiment, pushes the semiconductor package 410 away from the socket 420.

The ejector cam 401 can push the semiconductor package 410 away from the socket 420 a distance that may depend on dimensions such as the dimensions of the ejector cam 401 (e.g., the distance between the ejector rotational axis 501 and the cam bar axis 502), the distance between the regular position of the ejector cam 401 and the underside of the semiconductor package 410, the size of the upper surface channel of socket 420, etc. In one embodiment, the package ejector 400 pushes the semiconductor package 410 out of the socket 420 (e.g., the pins of the semiconductor package 410 disengage from the pin receptors 421 of socket 420). In another embodiment, the package ejector 400 pushes the semiconductor package 410 away from the socket 420 to partially disengage the semiconductor package 410 from socket 420 (e.g., the pins of the semiconductor package 410 are partially disengaged from the pin receptors 421 of socket 420).

FIG. 6 is an illustration of a package ejector system in accordance with another embodiment of the present invention. In one embodiment, socket 620 is coupled to printed circuit board 650. Embodiments of a printed circuit board include a computer motherboard, a processor board, a modem board, a video card board, a sound card board, etc. The printed circuit board 650 can include a connector 655. In one embodiment, the connector 655 is a bus connector and couples the printed circuit board 650 to an internal computer bus. In another embodiment, the connector 655 couples a processor board to a motherboard. Socket 620 may be mechanically and electrically coupled to printed circuit board 650. Semiconductor package 610 can be coupled to socket 620.

FIG. 7 shows a side view of the semiconductor package illustrated in FIG. 6. Semiconductor package 610 can include a semiconductor die (not shown) and pins 611 disposed on one half of the underside of semiconductor package 610. In another embodiment, semiconductor package 610 includes a multi-chip module. Pins 611 can be coupled with (e.g., inserted into) pin receptors (not shown) of socket 620 and can electrically couple the semiconductor die to socket 620.

Referring again to FIG. 6, package ejector 600 can be coupled to ejector housing 640 and package ejector return clip 630. In one embodiment, ejector housing 640 is coupled to socket 620 to couple package ejector 600 to socket 620. The ejector cam of package ejector 600 resides between the socket 620 and an interior portion of the underside of semiconductor package 610. FIG. 8 shows an isometric view of package ejector 600 illustrated in FIG. 6.

FIG. 9 shows package ejectors in accordance with additional embodiments of the present invention. Package ejector 900 can be a planar plastic unit including a handle 902 and an ejector paddle 901. In one embodiment, package ejector 900 can be coupled to a socket at a plurality of pivot points 911. Package ejector 950 can be a planar wire unit. In one embodiment, ejector cam 951 lies in the same plane as handle 952. Ejector cam 951 can include a plurality of ejector cam bars 953. In one embodiment, package ejector 950 can be coupled to a socket at a plurality of pivot points 961. In another embodiment, a package ejector is a composite piece including an ejection cam and a handle. For example, a composite package ejector can include a plurality of discrete, attached components (e.g., an ejection cam component can be attached to a handle component, etc.)

Figure 10:
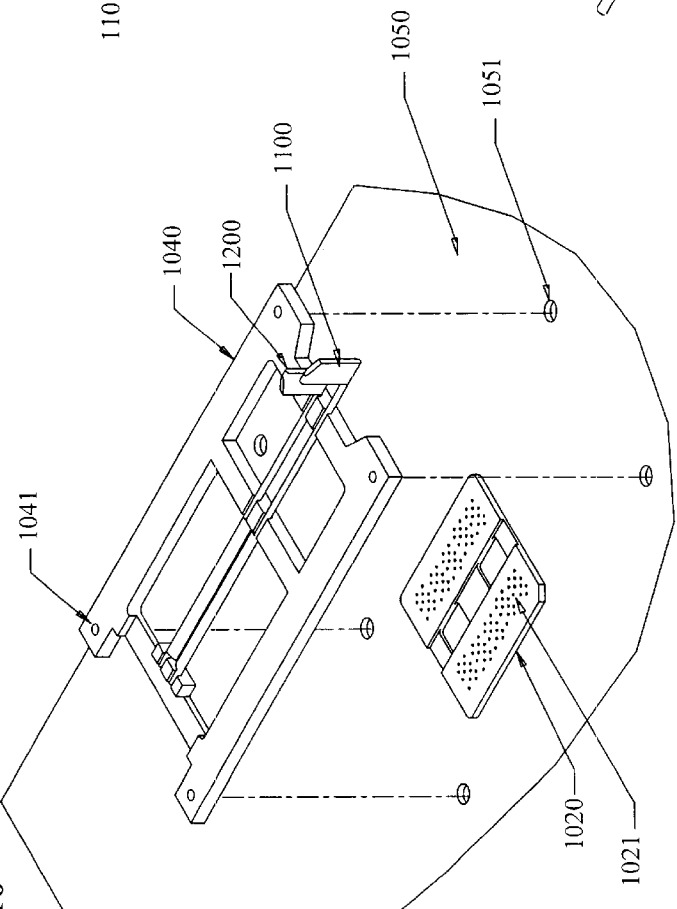
FIG. 10 is an illustration of another package ejector system in accordance with an embodiment of the present invention.

FIG. 10 is an illustration of another package ejector system in accordance with an embodiment of the present invention. Socket 1020 can includes pin receptors 1021 and can be coupled to processor board 1050. In one embodiment, processor board 1050 includes processor board attachment holes 1051. Ejector housing 1040 can include ejector housing attachment holes 1041 and can be coupled to processor board 1050 via a plurality of fasteners (e.g., bolts, rivets, etc.). Each of the plurality of fasteners can pass through a ejector housing attachment hole 1041 and a respective processor board attachment hole 1051. Each of first ejector 1100 and second ejector 1200 can be rotatably coupled to ejector housing 1040.

Figure 11:
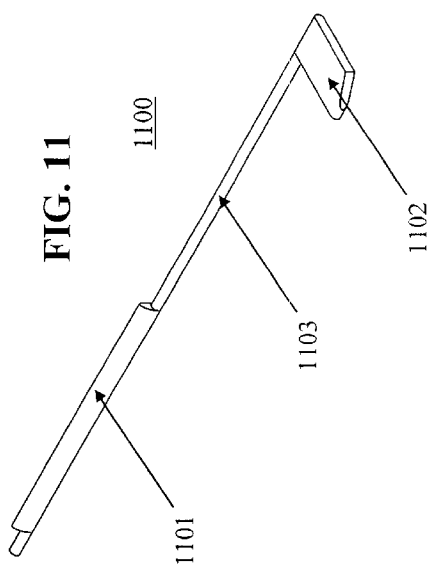
FIG. 11 shows an exploded view of an ejector illustrated in FIG. 10.
Figure 12:
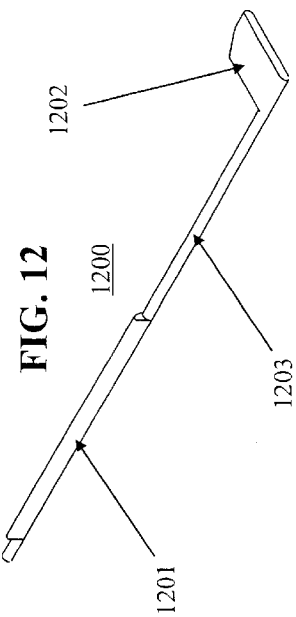
FIG. 12 shows an exploded view of another ejector illustrated in FIG. 10.

FIG. 11 shows an exploded view of an ejector illustrated in FIG. 10. In one embodiment, first ejector 1100 includes a cam 1101 a handle 1102, and a tie bar 1103. FIG. 12 shows an exploded view of another ejector illustrated in FIG. 10. Second ejector 1200 can include a cam 1201, a handle 1202, and a tie bar 1203. In one embodiment, when a semiconductor package (not shown) is coupled to socket 1020, and first ejector 1100 and second ejector 1200 are disposed therebetween with each in a regular position. When each of first ejector 1100 and second ejector 1200 are in such a regular position, cams 1101 and 1201 lie parallel to the top surface of board 1050 and handles 1102 and 1202 are positioned normal to the top surface of board 1050. To eject the semiconductor package (not shown) from socket 1020, each of first ejector 1100 and second ejector 1200 can be rotated from the regular position to an eject position such that (i) handles 1102 and 1202 rotate away from each other and toward the top surface of board 1040, and (ii) each of cams 1102 and 1202 rotate from parallel to the top surface of board 1050 to normal to the top surface of board 1050 and apply an ejection force to an interior portion of the underside of the semiconductor package (not shown). First ejector 1100 and second ejector 1200 can be rotated by applying a force to each of handles 1102, 1103 (e.g., via two fingers, a thumb and finger, etc.) respectively.

Embodiments of the present invention advantageously allow ejection of a semiconductor package from a semiconductor package socket with a package ejector including an ejector cam that can push the semiconductor package away from the semiconductor package socket.

In the foregoing detailed description, apparatus and methods in accordance with embodiments of the present invention have been described with reference to specific exemplary embodiments. Accordingly, the present specification and figures are to be regarded as illustrative rather than restrictive.

What is claimed is:

1. Apparatus for ejecting a semiconductor package from a semiconductor package socket including an upper surface, comprising
    a package ejector having an ejector cam, and a handle coupled to said sector cam; and
    said package ejector supported for rotation with respect to the semiconductor package socket,
    the spacing between the socket and a semiconductor package to be inserted in the socket being such that rotation of said package ejector will cause said ejector cam to contact and apply an ejection force to an interior portion of the underside of said semiconductor package substantially along an entire length of said interior portion to push the semiconductor package away from the semiconductor package socket.

2. The apparatus of claim 1, and further including an ejector paddle on said handle.

3. The apparatus of claim 1, wherein said package ejector is adapted to be rotatably supported in the semiconductor package socket.

4. The apparatus of claim 1, further comprising a package sector housing, wherein said package ejector housing is adapted to be mounted to the upper surface of the semiconductor package socket within an upper surface channel of the semiconductor package socket, and wherein said package ejector is rotatably supported in said package ejector housing.

5. The apparatus of claim 4, wherein said package ejector housing comprises tines for mounting the housing to corresponding bridges within the upper surface channel of the semiconductor package socket.

6. The apparatus of claim 4, wherein said package ejector is a wire unit and said package ejector housing comprises wire cradles for rotatably coupling the package ejector to the package ejector housing.

7. The apparatus of claim 1, wherein said package ejector is a wire unit and further includes a tie bar coupling said handle to said ejector cam, said tie bar supporting said package ejector for rotation with respect to the semiconductor package socket.

8. The apparatus of claim 1, further comprising a return clip coupled to the package ejector.

9. The apparatus of claim 1, wherein the ejector cam comprises an ejector cam bar having an axis that is parallel to and offset from a rotational axis of the ejector cam.

10. A circuit board assembly, comprising:
    a circuit board;
    a semiconductor package socket coupled to said circuit board;
    a package sector, rotatably supported with respect to said semiconductor package socket and disposed between said circuit board and said semiconductor package socket including an ejector cam, the spacing between said socket and the circuit board being such that rotation of said package ejector will cause said ejector cam to contact and apply an ejection force to an interior portion of the underside of said circuit board substantially along an entire length of said interior portion to push the circuit board away from the semiconductor package socket.

11. The circuit board assembly of claim 10, wherein:
    said semiconductor package socket defines an upper surface channel; and
    said ejector cam of said package ejector is disposed within said upper surface channel.

12. The circuit board assembly of claim 10, wherein the circuit board is inserted in said semiconductor package socket.

13. The circuit board assembly of claim 10, further comprising:
    a package ejector housing coupled to said semiconductor package socket, wherein said package ejector is rotatably supported said package ejector housing.

14. The circuit board assembly of claim 10, wherein said package ejector is a wire unit and further includes a tie bar coupling said handle to said ejector cam, said tie bar supporting said package ejector for rotation with respect to said semiconductor package socket.

15. The circuit board assembly of claim 10, further comprising a return clip coupled to the package ejector.

16. A method to eject a semiconductor package from a semiconductor socket, the method comprising:
    applying a first ejection force to a first interior portion of an underside of the semiconductor package substantially along an entire length of said first interior portion through contact with a first ejector cam, the first section force pushing the semiconductor package away from the semiconductor package socket.

17. The method of claim 16, the method further comprising:
    applying a second ejection force to a second interior portion of an underside of the semiconductor package substantially along an entire length of said second interior portion through contact with a second ejector cam, the second ejection force pushing the semiconductor package away from the semiconductor package socket, the second ejection force and the first ejection force being applied at least in part over a common period of time.

18. An apparatus for ejecting a semiconductor package from a semiconductor package socket including an upper surface, comprising:
    a first package ejector having an ejector cam, and a handle coupled to said ejector cam;
    said first package ejector supported for rotation with respect to the semiconductor package socket, the spacing between the socket and a semiconductor package to be inserted in the socket being such that rotation of said package ejector will cause said ejector cam to contact and to apply an ejection force to an interior portion of the underside of said semiconductor package substantially along an entire length of said interior portion to push the semiconductor package away from the semiconductor package socket;
    a second package ejector having an ejector cam, and a handle coupled to said ejector cam,
    said second package ejector supported for rotation with respect to said semiconductor package socket, the spacing between said socket and a semiconductor package to be inserted in said socket being such that rotation of said package ejector will cause said ejector cam to apply an ejection force to an interior portion of the underside of said semiconductor package substantially along an entire length of said interior portion to push the semiconductor package away from the semiconductor package socket.

19. The apparatus of claim 18, and further including an ejector paddle on said handle.

20. Apparatus comprising:
a semiconductor package socket including an upper surface;
a semiconductor package inserted in said semiconductor package socket;
a package ejector having a handle, an sector cam, and a tie bar, said tie bar coupling said handle to said ejector cam; and
said tie bar supported for rotation in said semiconductor package socket, the spacing between said socket and a semiconductor package being such that rotation of said tie bar will cause said ejector cam to contact and to apply an ejection force to an interior portion of the underside of said semiconductor package substantially along an entire length of said interior portion to push the semiconductor package away from the semiconductor package socket.

21. The apparatus of claim 20, and further including an ejector paddle on said handle.

22. The apparatus of claim 20, further comprising a package ejector housing, wherein said package ejector housing is coupled to said upper surface of said semiconductor package socket and resides within an upper surface channel of said semiconductor package, said tie bar supported for rotation in said package ejector housing.

23. The apparatus of claim 20, wherein said package ejector is a wire unit.

24. The apparatus of claim 20, further comprising a return clip coupled to the package ejector.

* * * * *

UNITED STATES PATENT AND TRADEMARK OFFICE
CERTIFICATE OF CORRECTION

PATENT NO.      : 6,490,167 B1
DATED           : December 3, 2002
INVENTOR(S)     : Brownell et al.

It is certified that error appears in the above-identified patent and that said Letters Patent is hereby corrected as shown below:

<u>Column 7,</u>
Line 15, change "sector cam" to -- ejector cam --.
Line 32, change "sector housing" to -- ejector housing --.
Line 61, change "package sector" to -- package ejector --.

<u>Column 9,</u>
Line 12, change "an sector" to -- an ejector --.

Signed and Sealed this

Twenty-seventh Day of January, 2004

JON W. DUDAS
*Acting Director of the United States Patent and Trademark Office*